US012740076B2

(12) United States Patent
Park et al.

(10) Patent No.: US 12,740,076 B2
(45) Date of Patent: Sep. 15, 2026

(54) INTEGRATED CIRCUIT DEVICE

(71) Applicant: SAMSUNG ELECTRONICS CO., LTD., Suwon-si (KR)

(72) Inventors: Jungmin Park, Suwon-si (KR); Hanjin Lim, Suwon-si (KR); Hyungsuk Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 460 days.

(21) Appl. No.: 18/239,847

(22) Filed: Aug. 30, 2023

(65) Prior Publication Data

US 2024/0072105 A1 Feb. 29, 2024

(30) Foreign Application Priority Data

Aug. 31, 2022 (KR) ........................ 10-2022-0110329

(51) Int. Cl.
*H10D 1/68* (2025.01)
*H10B 12/00* (2023.01)

(52) U.S. Cl.
CPC ............. *H10D 1/68* (2025.01); *H10B 12/315* (2023.02)

(58) Field of Classification Search
CPC ................................ H10D 1/68; H10B 12/315
USPC .......................................................... 257/306
See application file for complete search history.

(56) References Cited

U.S. PATENT DOCUMENTS 10,096,352 B2 10/2018 Khan et al.
10,374,054 B2 8/2019 Yoo
10,611,868 B2 4/2020 Wakita et al.
10,923,501 B2 2/2021 Yoo
11,121,139 B2 9/2021 Frank
2020/0286984 A1 9/2020 Chang et al.
2021/0328004 A1* 10/2021 Lee ........................ H10D 1/684
2021/0359100 A1 11/2021 Maeng et al.
2021/0359101 A1 11/2021 Heo et al.
2023/0163160 A1* 5/2023 Park ....................... H10D 1/694 257/298
2023/0320075 A1* 10/2023 Park ....................... H10D 1/696 257/296
2024/0023343 A1* 1/2024 Koo ....................... H10B 53/30

FOREIGN PATENT DOCUMENTS

KR 10-0716652 B1 5/2007
KR 10-1748612 B1 6/2017
KR 1020200033010 A 3/2020
KR 1020200115693 A 10/2020
KR 1020220112124 A 8/2022

* cited by examiner

*Primary Examiner* — Igwe U Anya
(74) *Attorney, Agent, or Firm* — Muir Patent Law, PLLC

(57) ABSTRACT

An integrated circuit device includes a transistor disposed on a substrate and a capacitor structure electrically connected with the transistor, wherein the capacitor structure includes a first electrode, a dielectric film composite disposed on the first electrode, and a second electrode disposed on the dielectric film composite, and the dielectric film composite includes a first dielectric film including an anti-ferroelectric material, a second dielectric filler distributed and disposed in the first dielectric film, the second dielectric filler including a ferroelectric material, and a third dielectric filler distributed and disposed in the first dielectric film, the third dielectric filler including a paraelectric material and having an average diameter which is less than an average diameter of the second dielectric filler.

20 Claims, 15 Drawing Sheets

INTEGRATED CIRCUIT DEVICE

CROSS-REFERENCE TO RELATED APPLICATION

This application is based on and claims priority under 35 U.S.C. § 119 to Korean Patent Application No. 10-2022-0110329, filed on Aug. 31, 2022, in the Korean Intellectual Property Office, the disclosure of which is incorporated by reference herein in its entirety.

BACKGROUND

The inventive concept relates to an integrated circuit device, and more particularly, to an integrated circuit device including a capacitor.

Recently, as subdivided semiconductor process technology advances rapidly, the high integration of integrated circuit devices has accelerated, and due to this, an area of a unit cell is reduced. Therefore, an area, occupied by a capacitor, of a unit cell may also decrease. For example, in integrated circuit devices such as dynamic random access memory (DRAM), the degree of integration increases and an area of a unit cell is reduced, but a desired capacitance is maintained or increases. Therefore, capacitors need a structure which may maintain a desired electrical characteristic by solving a spatial limitation and a limitation of a design rule and enhancing a capacitance.

SUMMARY

The inventive concept provides an integrated circuit device which includes a capacitor structure for securing a desired capacitance.

The object of the inventive concept is not limited to the aforesaid, but other objects not described herein will be clearly understood by those of ordinary skill in the art from descriptions below.

According to an aspect of the inventive concept, there is provided an integrated circuit device including a transistor disposed on a substrate and a capacitor structure electrically connected with the transistor, wherein the capacitor structure includes a first electrode, a dielectric film composite disposed on the first electrode, and a second electrode disposed on the dielectric film composite, and the dielectric film composite includes a first dielectric film including an anti-ferroelectric material, a second dielectric filler distributed and disposed in the first dielectric film, the second dielectric filler including a ferroelectric material, and a third dielectric filler distributed and disposed in the first dielectric film, the third dielectric filler including a paraelectric material and having an average diameter which is less than an average diameter of the second dielectric filler.

According to another aspect of the inventive concept, there is provided an integrated circuit device including a transistor disposed on a substrate and a capacitor electrically connected with the transistor, the capacitor including a first electrode, a dielectric film composite, and a second electrode, wherein the dielectric film composite includes a first dielectric film including an anti-ferroelectric material and configuring first grains, a second dielectric filler distributed and disposed in the first dielectric film, the second dielectric filler including a ferroelectric material and configuring second grains, and a third dielectric filler distributed and disposed at a grain boundary between the first grains and the second grains, the third dielectric filler including a paraelectric material.

According to another aspect of the inventive concept, there is provided an integrated circuit device including a word line disposed in a word line trench extending in a first direction in a substrate, a contact structure disposed at one side of the word line on the substrate, and a capacitor structure disposed on the contact structure and electrically connected with the contact structure, wherein the capacitor structure includes a first electrode disposed on the contact structure, a dielectric film composite covering the first electrode, and a second electrode disposed on the dielectric film composite, and the dielectric film composite includes a first dielectric film including an anti-ferroelectric material, a second dielectric filler distributed and disposed in the first dielectric film, the second dielectric filler including a ferroelectric material, and a third dielectric filler distributed and disposed in the first dielectric film, the third dielectric filler including a paraelectric material and having an average diameter which is less than an average diameter of the second dielectric filler.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Hereinafter, various embodiments will be described in detail with reference to the accompanying drawings.

Figure 1:
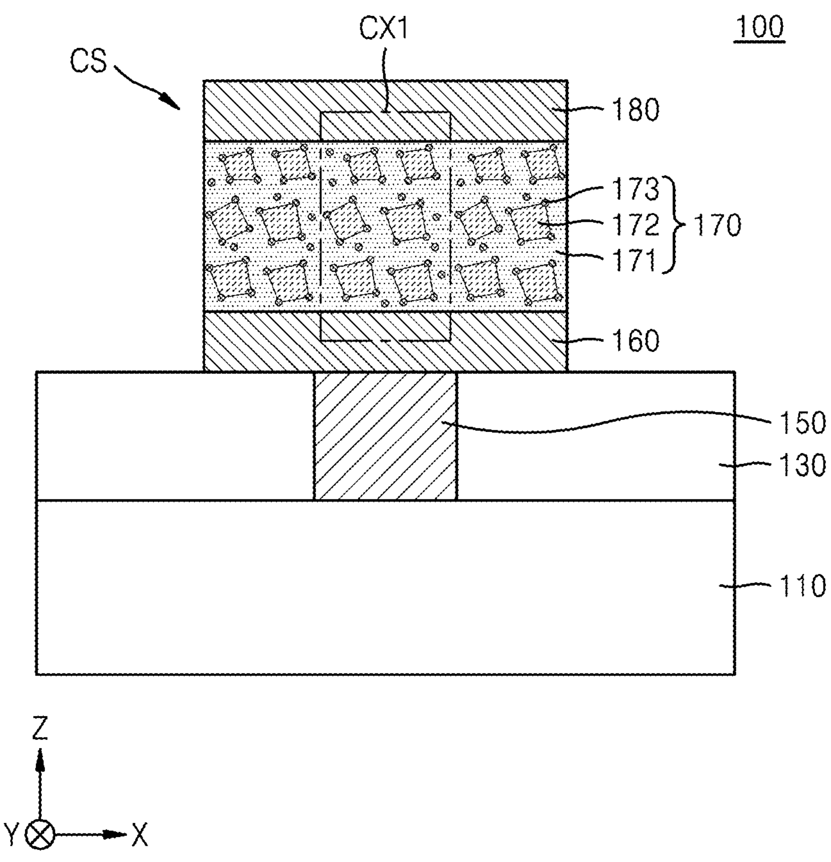
FIG. 1 is a cross-sectional view illustrating an integrated circuit device according to an embodiment.
Figure 2:
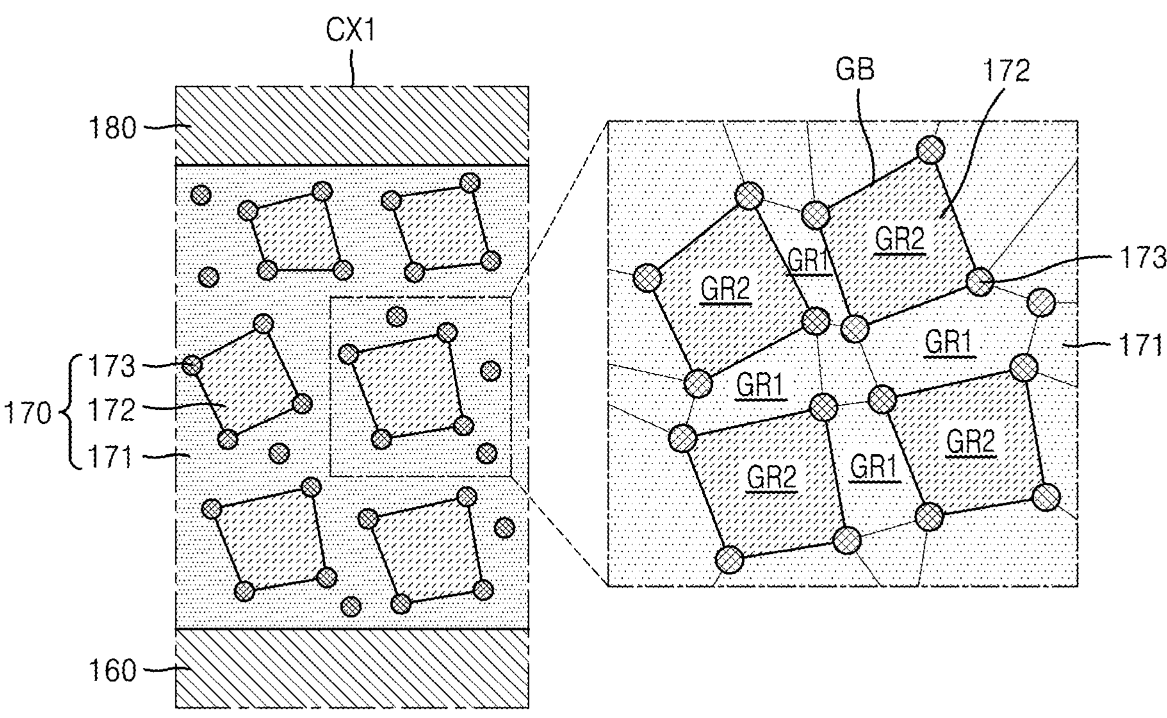
FIG. 2 is an enlarged view of a region CX1 of FIG. 1.

FIG. 1 is a cross-sectional view illustrating an integrated circuit device 100 according to an embodiment, and FIG. 2 is an enlarged view of a region CX1 of FIG. 1.

Referring to FIGS. 1 and 2, the integrated circuit device 100 according to an embodiment may include a lower insulation layer 130 disposed on a substrate 110, a contact 150 disposed on the substrate 110 and covered by the lower insulation layer 130, and a capacitor structure CS disposed on the contact 150.

The substrate 110 may include a semiconductor material such as silicon (Si), germanium (Ge), silicon germanium (SiGe), silicon carbide (SiC), gallium arsenide (GaAs), indium arsenide (InAs), or indium phosphide (InP). In some embodiments, the substrate 110 may include a conductive region (for example, an impurity-doped well or an impurity-doped structure).

Although not shown, a switching element such as a diode or a transistor transferring a signal to the capacitor structure CS may be provided on the substrate 110. The lower insulation layer 130 may be formed on the substrate 110 to cover the switching element, and the contact 150 may be electrically connected to the switching element.

The capacitor structure CS may include a first electrode 160, a dielectric film composite 170, and a second electrode 180, which are sequentially arranged on the contact 150. In some embodiments, the dielectric film composite 170 may be disposed between the first electrode 160 and the second electrode 180, and the first electrode 160 may be disposed to contact the contact 150. In some embodiments, the dielectric film composite 170 may be disposed between the first electrode 160 and the second electrode 180, and the second electrode 180 may be disposed to contact the contact 150.

Each of the first electrode 160 and the second electrode 180 may include, for example, at least one of metals, such as doped polysilicon, doped silicon, ruthenium (Ru), titanium (Ti), tantalum (Ta), and tungsten (W), and metal nitrides such as titanium nitride (TiN), tantalum nitride (TaN), tungsten nitride (WN), chrome nitride (CrN), vanadium nitride (VN), molybdenum nitride (MoN), niobium nitride (NbN), titanium silicon nitride (TiSiN), titanium aluminum nitride (TiAlN), and tantalum aluminum nitride (TaAlN). In some embodiments, each of the first electrode 160 and the second electrode 180 may include a single-layer or multi-layer structure of each of the materials.

The dielectric film composite 170 may include a first dielectric film 171, which configures a matrix and is a main component thereof, and a plurality of second dielectric fillers 172 and a plurality of third dielectric fillers 173, which are mixed to configure a nano-size three-dimensional (3D) structure and are secondary components thereof. That is, the plurality of second and third dielectric fillers 172 and 173 may be distributed and disposed in the first dielectric film 171. The dielectric film composite 170 may have a thickness of about 10 Å to about 60 Å in a thickness direction (for example, a Z direction of FIG. 1) of the dielectric film composite 170.

The first dielectric film 171 may include an anti-ferroelectric material. For example, the first dielectric film 171 may include at least one of $Hf_{1-x}Zr_xO_2$ ($0.5<x<1.0$), $ZrO_2$, $PbZrO_3$, and $PbHfO_3$. Also, the anti-ferroelectric material may further include a dopant, and the dopant may include at least one of aluminum (Al), titanium (Ti), tantalum (Ta), niobium (Nb), lanthanum (La), yttrium (Yt), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn).

In some embodiments, a content of the first dielectric film 171 included in the dielectric film composite 170 may be higher than a sum of a content of the plurality of second dielectric fillers 172 and a content of the plurality of third dielectric fillers 173, with respect to a total mass of the dielectric film composite 170. For example, the first dielectric film 171 may be included in the dielectric film composite 170 by a content of about 50% or more with respect to the dielectric film composite 170. Also, the first dielectric film 171 may have a polarization feature based on a T-phase of a tetragonal crystal structure.

The plurality of second dielectric fillers 172 may include a ferroelectric material. For example, the plurality of second dielectric fillers 172 may include at least one of $HfO_2$, $Hf_{1-x}Zr_xO_2$ ($0<x\leq0.5$) $Ba_{1-x}Sr_xTiO_3$ ($0\leq x\leq0.3$), $BaTiO_3$, and $PbZr_xTi_{1-x}O_3$ ($0\leq x\leq0.1$). Also, the ferroelectric material may further include a dopant, and the dopant may include at least one of Al, Ti, Ta, Nb, La, Yt, Mg, Si, Ca, Ce, Dy, Er, Gd, Ge, Sc, Sr, and Sn.

In some embodiments, the plurality of second dielectric fillers 172 may be included in the dielectric film composite 170 by a content of about 10% or more and less than about 50%, with respect to a total mass of the dielectric film composite 170. Also, the plurality of second dielectric fillers 172 may have an average diameter of about 5 Å to about 20 Å. Also, the second dielectric fillers 172 may have a polarization feature based on an O-phase of an orthorhombic crystal structure.

The plurality of third dielectric fillers 173 may include a paraelectric material. For example, the plurality of third dielectric fillers 173 may include at least one of $Y_2O_3$, $Al_2O_3$, $ZrO_2$, $SiO_2$, $TiO_2$, and $Cr_2O_3$. Also, the plurality of third dielectric fillers 173 may include a material where bandgap energy Eg is high. For example, the plurality of third dielectric fillers 173 may include a dielectric where bandgap energy Eg is at least 5.0 eV.

In some embodiments, the plurality of third dielectric fillers 173 may be included in the dielectric film composite 170 by a content of about 1% or more and less than about 10%, with respect to a total mass of the dielectric film composite 170. Also, the plurality of third dielectric fillers 173 may have an average diameter of about 1 Å to about 5 Å. That is, an average diameter of the plurality of third dielectric fillers 173 may be less than an average diameter of the plurality of second dielectric fillers 172.

In the integrated circuit device 100 according to an embodiment, the first dielectric film 171 may include first grains GR1, and the plurality of second dielectric fillers 172 may include second grains GR2. A boundary region where the first grains GR1 are adjacent to the second grains GR2 may be referred to as a grain boundary GB. As illustrated, the plurality of third dielectric fillers 173 may be distributed and disposed in the grain boundary GB between the first grains GR1 and the second grains GR2. Therefore, the plurality of third dielectric fillers 173 may apply strain to the first grains GR1 and the second grains GR2.

Because the plurality of third dielectric fillers 173 are distributed and disposed in the grain boundary GB, a content of materials included in the plurality of third dielectric fillers 173 may have a discrete distribution having a certain numerical value at a peak position. A content of materials of the plurality of third dielectric fillers 173 may be measured by energy dispersive spectroscopy of a transmission electron microscope or energy dispersive spectroscopy of a scanning electron microscope.

The first grains GR1 may be referred to as a non-polar region where spontaneous polarization does not occur, based on a characteristic of an anti-ferroelectric material. On the other hand, the second grains GR2 may be referred to as a polar region where spontaneous polarization occurs, based on a characteristic of a ferroelectric material.

Although the inventive concept is not limited to a certain theory, the dielectric film composite 170 may be configured with a nano-size 3D structure, and thus, a size effect may be minimized and crystallizability may be accelerated based on a 3D strain effect between mixed dielectric materials. Therefore, when an electric field is applied to the dielectric film composite 170, a polar region may three-dimensionally affect a non-polar region due to a phase interaction between the first grains GR1 and the second grains GR2, and thus, a polarization of the dielectric film composite 170 may be overall accelerated.

That is, three different kinds of dielectric materials (a ferroelectric material, an anti-ferroelectric material, and a paraelectric material) may be formed in a 3D composite structure instead of a two-dimensional (2D) stack structure, and thus, the capacitor structure CS may have a relatively high capacitance.

As a result, the integrated circuit device 100 according to an embodiment may include the dielectric film composite 170 having a nano-size, where three different kinds of dielectric materials are three-dimensionally mixed and arranged, and thus, the capacitor structure CS for securing a desired capacitance may be efficiently implemented.

Figure 3:
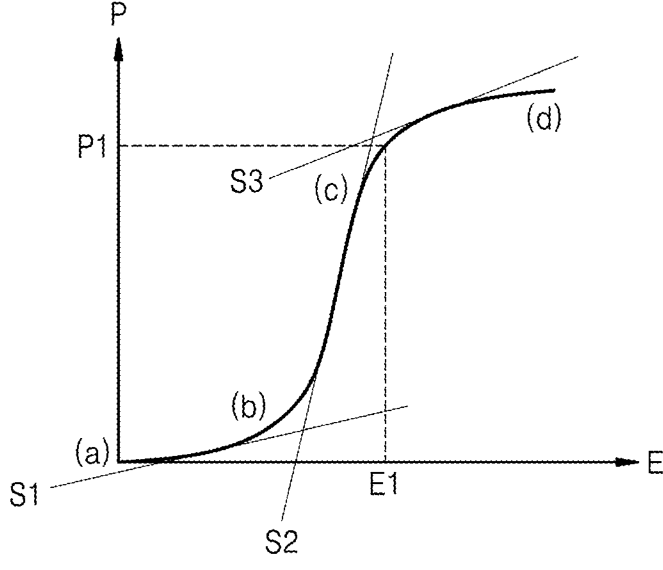
FIG. 3 is a graph showing a polarization-electric field curve of a dielectric film composite of FIG. 1.

FIG. 3 is a graph showing a polarization-electric field curve of a dielectric film composite of FIG. 1, and FIGS. 4A to 4D are schematic views illustrating a polarization direction based on each point in the polarization-electric field curve of FIG. 3.

Referring to FIGS. 3 and 4A to 4D, in a dielectric film composite 170 of an integrated circuit device 100 (see FIG. 1) according to an embodiment, a portion of a hysteresis loop representing a variation of polarization P based on a variation of an electric field E is shown.

In the polarization-electric field curve, the dielectric film composite 170 according to an embodiment may have first to fourth points a to d and first to third slopes S1 to S3, based on an interaction between a first dielectric film 171 and a plurality of second and third dielectric fillers 172 and 173 having different polarization characteristics.

In the integrated circuit device 100 (see FIG. 1) according to an embodiment, an electric field may be applied until before traveling to the third slope S3 (i.e., a point where polarization is P1 when an electric field is E1), in order to use the dielectric film composite 170 as a capacitor until only a point where remanent polarization does not occur. In other words, an electric field may be removed before reaching saturation where polarization does not increase, and thus, when an electric field is completely removed (E=0), polarization may be completely removed (P=0).

Figure 4A:
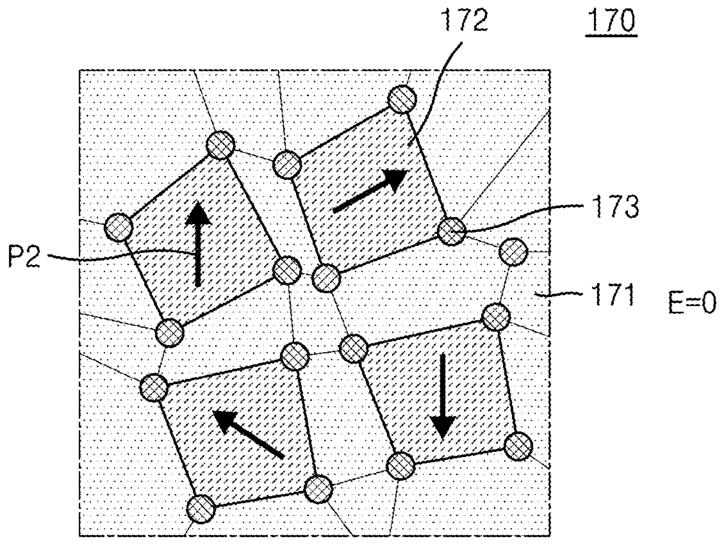
FIGS. 4A to 4D are schematic views illustrating a polarization direction based on each point in the polarization-electric field curve of FIG. 3.

To describe a first point a of FIG. 3 in FIG. 4A, when an electric field E is not applied to the dielectric film composite 170, spontaneous polarization may not occur in first grains GR1 (see FIG. 2) of a first dielectric film 171 due to a characteristic of an anti-ferroelectric material thereof, and spontaneous polarization may occur in second grains GR2 (see FIG. 2) of a plurality of second dielectric fillers 172 due to a characteristic of a ferroelectric material thereof, whereby the second grains GR2 of the plurality of second dielectric fillers 172 may form second polarization P2.

Figure 4B:
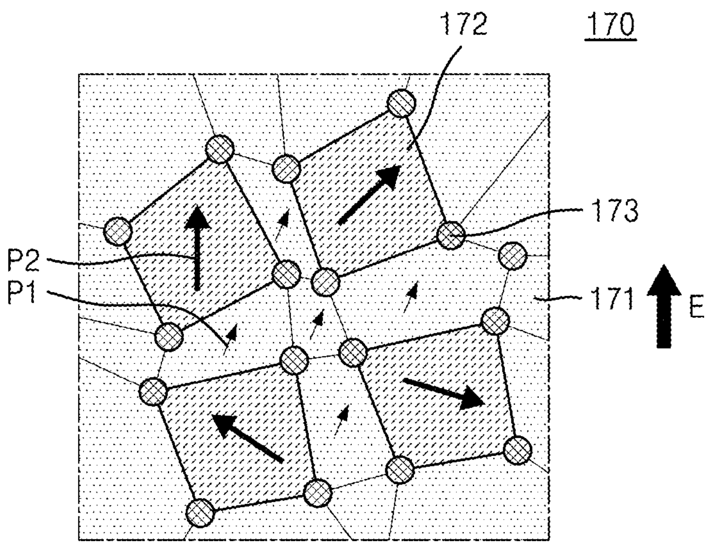

To describe a second point b of FIG. 3 in FIG. 4B, when an electric field E starts to be applied to a dielectric film composite 170, first polarization P1 may occur in first grains GR1 (see FIG. 2) of a first dielectric film 171, and second polarization P2 may occur more in second grains GR2 (see FIG. 2) of a plurality of second dielectric fillers 172.

Figure 4C:
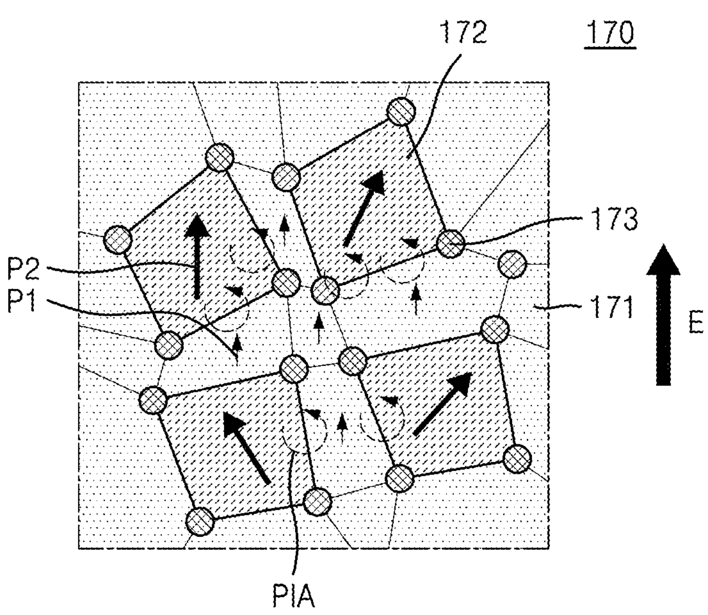

To describe a third point c of FIG. 3 in FIG. 4C, when an electric field E is applied to a dielectric film composite 170 as E1, first polarization P1 may occur more in first grains GR1 (see FIG. 2) of a first dielectric film 171, and second polarization P2 may occur far more in second grains GR2 (see FIG. 2) of a plurality of second dielectric fillers 172.

Therefore, based on a phase interaction PIA between the first grains GR1 (see FIG. 2) and the second grains GR2 (see FIG. 2) increasing, first polarization P1 in the first grains GR1 (see FIG. 2) of the first dielectric film 171 may be accelerated. That is, based on a relatively small electric field E, relatively large polarization P may be formed in the dielectric film composite 170 according to an embodiment.

Figure 4D:
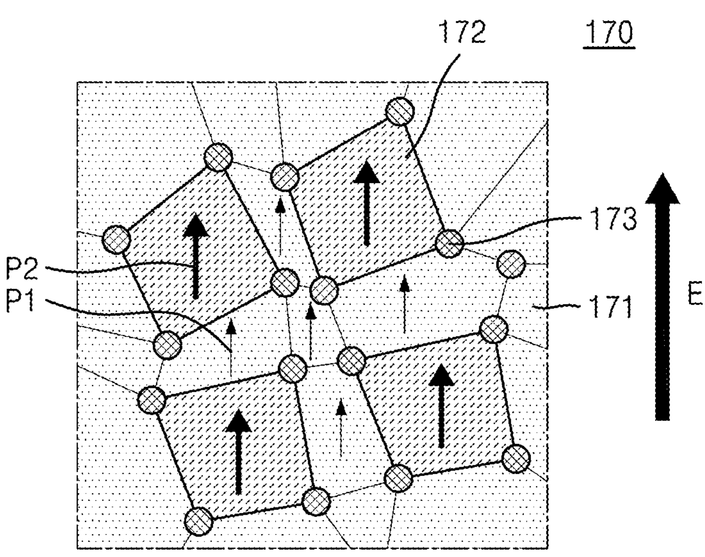

To describe a fourth point d of FIG. 3 in FIG. 4D, when an electric field E is maximally applied to a dielectric film composite 170, first polarization P1 may be saturated in first grains GR1 (see FIG. 2) of a first dielectric film 171, and second polarization P2 may be saturated in second grains GR2 (see FIG. 2) of a plurality of second dielectric fillers 172.

That is, polarization Pin all of the dielectric film composite 170 may reach saturation. However, as described above, the fourth point d of FIG. 3 may correspond to a region which is not used in the integrated circuit device 100 (see FIG. 1) according to an embodiment, but is illustrated for convenience of description.

As described above, the inventors confirmed that relatively large polarization P may be formed with a relatively small electric field E, in the polarization-electric field curve using the dielectric film composite 170 according to an embodiment. Although the inventive concept is not limited to a certain theory, in the dielectric film composite 170 according to an embodiment, three different kinds of dielectric materials (a ferroelectric material, an anti-ferroelectric material, and a paraelectric material) may be formed in a 3D composite structure, and thus, the dielectric film composite 170 may have a relatively high capacitance.

Figure 5:
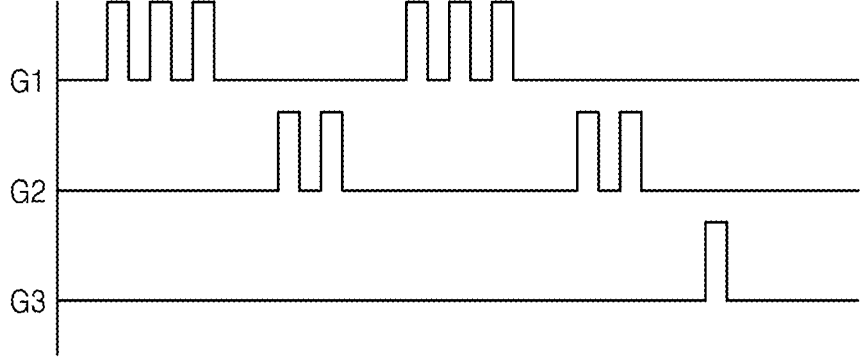
FIG. 5 is a schematic flow rate flowchart illustrating a supply pattern of a process gas for forming the dielectric film composite of FIG. 1.

FIG. 5 is a schematic flow rate flowchart illustrating a supply pattern of a process gas for forming a dielectric film composite of an integrated circuit device, according to an embodiment.

Referring to FIGS. 1 and 5, a process of forming a dielectric film composite 170 of an integrated circuit device 100 according to an embodiment may be an atomic layer deposition (ALD) process.

In an ALD process according to an embodiment, a supply pattern of a process gas for forming the dielectric film composite 170 including three different kinds of dielectric materials may include a first gas supply process G1 of supplying an anti-ferroelectric formation process, a second gas supply process G2 of supplying a ferroelectric formation process, and a third gas supply process G3 of supplying a paraelectric formation process.

First, the supply of the anti-ferroelectric formation process may be performed, and then, the supply of the anti-ferroelectric formation process may stop and the supply of a purge gas may be performed, thereby forming at least a portion of the first dielectric film 171. The first gas supply process G1 may be repeatedly performed a plurality of times.

Subsequently, the supply of the ferroelectric formation process may be performed, and then, the supply of the ferroelectric formation process may stop and the supply of the purge gas may be performed, thereby forming at least a portion of the second dielectric filler 172. The second gas supply process G2 may be repeatedly performed a plurality of times which is less than the first gas supply process G1.

Subsequently, the supply of the paraelectric formation process may be performed, and then, the supply of the paraelectric formation process may stop and the supply of the purge gas may be performed, thereby forming at least a portion of the third dielectric filler 173. The third gas supply process G3 may be repeatedly performed a plurality of times which is less than the second gas supply process G2.

In some embodiments, an interval may be between a plurality of process gas supply processes. A supply time of the second gas supply process G2 may differ from that of the first gas supply process G1, and a supply time of the third gas supply process G3 may differ from that of the second gas supply process G2. A period of an interval and the number of intervals may be variously determined to optimize formation of the dielectric film composite 170. Also, the plurality of process gas supply processes may have the same period or different periods. This may be changed based on a desired thickness and properties of the dielectric film composite 170, and is not limited.

As a result, each of the plurality of process gas supply processes may be repeatedly performed certain times, and thus, the dielectric film composite 170 having a desired thickness may be formed. Accordingly, in the integrated circuit device 100 according to an embodiment, the dielectric film composite 170 may be formed in a nano-size 3D structure which has a thickness of about 10 Å to about 60 Å in a thickness direction (for example, the Z direction of FIG. 1) of the dielectric film composite 170.

Figure 6:
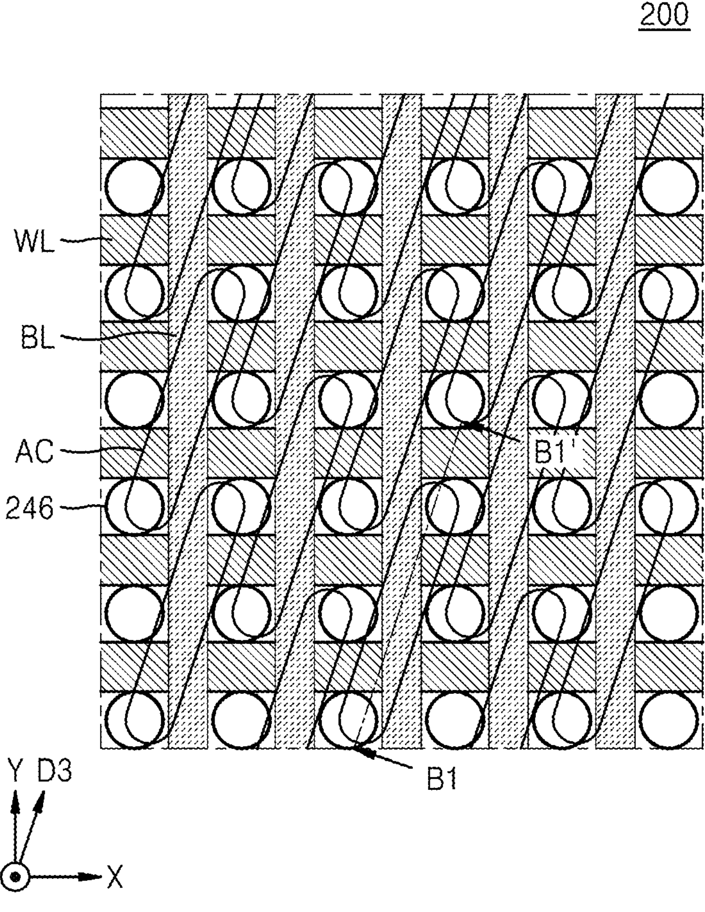
FIG. 6 is a layout illustrating an integrated circuit device according to an embodiment.
Figure 7:
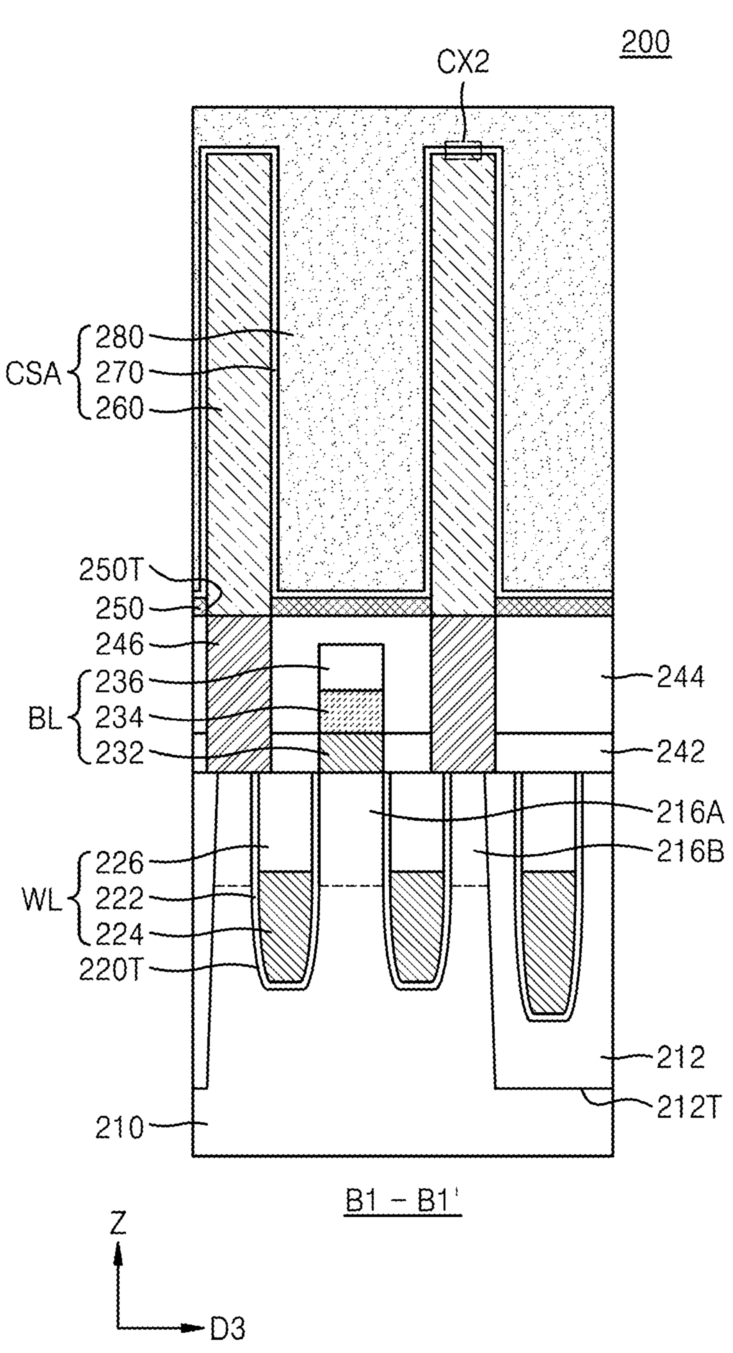
FIG. 7 is a cross-sectional view taken along line B1-B1' of FIG. 6.
Figure 8:
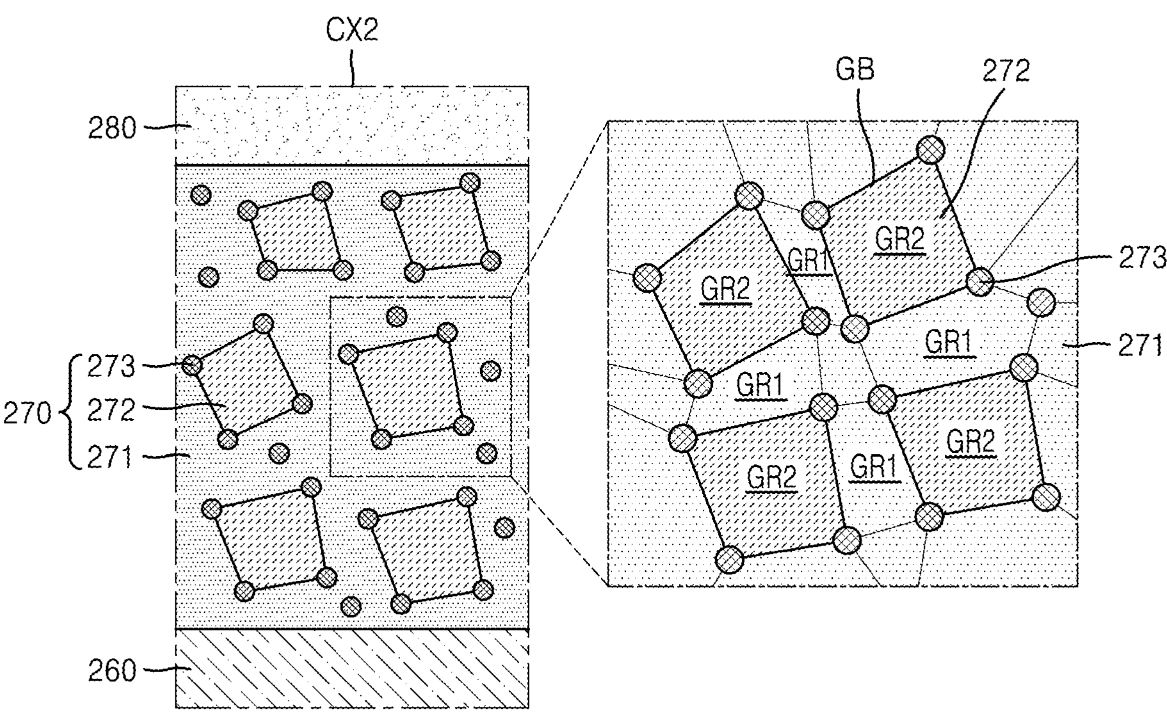
FIG. 8 is an enlarged view of a region CX2 of FIG. 7.

FIG. 6 is a layout illustrating an integrated circuit device 200 according to an embodiment, FIG. 7 is a cross-sectional view taken along line B1-B1' of FIG. 6, and FIG. 8 is an enlarged view of a region CX2 of FIG. 7.

Referring to FIGS. 6 to 8, the integrated circuit device 200 may include a capacitor structure CSA on a buried channel array transistor (BCAT).

A substrate 210 may include an active region AC defined by a device isolation layer 212. In some embodiments, the substrate 210 may include a Si wafer.

In some embodiments, the device isolation layer 212 may have a shallow trench isolation (STI) structure. For example, the device isolation layer 212 may include an insulation material which is filled into a device isolation trench 212T formed in the substrate 210. The insulation material may include fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ).

The active region AC may have an island shape which has a short axis and a long axis and is relatively long. As illustrated, the long axis of the active region AC may be arranged in a D3 direction parallel to an upper surface of the substrate 210. In some embodiments, the active region AC may have a first conductive type. The first conductive type may be a p type (or an n type).

The substrate 210 may include a word line trench 220T which extends in an X direction. The word line trench 220T may intersect with the active region AC and may be formed to have a certain depth from the upper surface of the substrate 210. A portion of the word line trench 220T may extend to an inner portion of the device isolation layer 212, and a portion of the word line trench 220T formed in the device isolation layer 212 may include a bottom surface at a level which is lower than a portion of the word line trench 220T formed in the active region ACT.

A first source/drain region 216A and a second source/drain region 216B may be disposed at an upper portion of the active region AC disposed at both sides of the word line trench 220T. The first source/drain region 216A and the second source/drain region 216B may each be an impurity region on which impurities having a second conductive type differing from the first conductive type are doped. The second conductive type may be an n type (or a p type).

A word line WL may be formed in the word line trench 220T. The word line WL may include a gate insulation layer 222, a gate electrode 224, and a gate capping layer 226, which are sequentially formed on in an inner wall of the word line trench 220T.

The gate insulation layer 222 may be conformally formed on the inner wall of the word line trench 220T. The gate insulation layer 222 may include at least one material selected from among silicon oxide, silicon nitride, silicon oxynitride, oxide/nitride/oxide (ONO), and a high-k dielectric material having a dielectric constant which is higher than that of silicon oxide. For example, the gate insulation layer 222 may have a dielectric constant of about 10 to about 25. In some embodiments, the gate insulation layer 222 may include $HfO_2$, $Al_2O_3$, $HfAlO_3$, $Ta_2O_3$, $TiO_2$, or a combination thereof.

The gate electrode 224 may be formed to fill the word line trench 220T up to a certain height from a bottom portion of the word line trench 220T, on the gate insulation layer 222. The gate electrode 224 may include a work function adjustment layer (not shown) disposed on the gate insulation layer 222 and a buried metal layer (not shown) which fills the bottom portion of the word line trench 220T, on the work function adjustment layer. For example, the work function adjustment layer may include metal such as Ti, TiN, TiAlN, TiAlC, TiAlCN, TiSiCN, Ta, TaN, TaAlN, TaAlCN, or TaSiCN, metal nitride, or metal carbide, and the buried metal layer may include at least one of W, WN, TiN, and TaN.

The gate capping layer 226 may fill a remanent portion of the word line trench 220T, on the gate electrode 224. For example, the gate capping layer 226 may include at least one of silicon oxide, silicon nitride, and silicon oxynitride.

A bit line BL extending in a Y direction vertical to an X direction may be formed on the first source/drain region 216A. The bit line BL may include a bit line contact 232, a bit line conductive layer 234, and a bit line capping layer 236, which are sequentially stacked on the substrate 210. For example, the bit line contact 232 may include polysilicon, and the bit line conductive layer 234 may include a metal material. The bit line capping layer 236 may include an insulation material such as silicon nitride or silicon oxynitride. In the drawings, a bottom surface of the bit line contact 232 is illustrated to be at the same level as an upper surface of the substrate 210, but is not limited thereto and the bottom surface of the bit line contact 232 may be formed at a level which is lower than the upper surface of the substrate 210.

Optionally, a bit line middle layer (not shown) may be disposed between the bit line contact 232 and the bit line conductive layer 234. The bit line middle layer may include metal silicide, such as tungsten silicide, or metal nitride such as tungsten nitride. A bit line spacer (not shown) may be further formed on a bit line BL sidewall. The bit line spacer may include a single-layer or multi-layer structure including an insulation material such as silicon oxide, silicon nitride, or silicon oxynitride. Also, the bit line spacer may further include an air spacer (not shown).

A first interlayer insulation layer 242 may be formed on the substrate 210, and the bit line contact 232 may pass through the first interlayer insulation layer 242 and may be connected with the first source/drain region 216A. The bit line conductive layer 234 and the bit line capping layer 236 may be disposed on the first interlayer insulation layer 242. A second interlayer insulation layer 244 may be disposed to cover a side surface and an upper surface of the bit line capping layer 236 and a side surface of the bit line conductive layer 234, on the first interlayer insulation layer 242.

A contact structure 246 may be disposed on the second source/drain region 216B. The first and second interlayer insulation layers 242 and 244 may surround a sidewall of the contact structure 246. In some embodiments, the contact structure 246 may include a lower contact pattern (not shown), a metal silicide layer (not shown), and an upper contact pattern (not shown), which are sequentially stacked on the substrate 210, and a barrier layer (not shown) which surrounds a side surface and a bottom surface of the upper contact pattern. In some embodiments, the lower contact pattern may include polysilicon, and the upper contact pattern may include a metal material. The barrier layer may include metal nitride having conductivity.

The capacitor structure CSA may be formed on the second interlayer insulation layer 244. The capacitor structure CSA may include a lower electrode 260 electrically connected with the contact structure 246, a dielectric film composite 270 on the lower electrode 260, and an upper electrode 280 on the dielectric film composite 270. Furthermore, an etch stop layer 250 including an opening portion 250T may be formed on the second interlayer insulation layer 244, and a bottom portion of the lower electrode 260 may be disposed in the opening portion 250T of the etch stop layer 250.

In the drawings, it is illustrated that the capacitor structure CSA is repeatedly arranged in the X direction and the Y direction on the contact structure 246 which is repeatedly arranged in the X direction and the Y direction. However, unlike the illustration, the capacitor structure CSA may be arranged in a hexagonal shape, such as a honeycomb structure, on the contact structure 246 repeatedly arranged in the X direction and the Y direction, and in this case, a landing pad (not shown) may be formed between the contact structure 246 and the capacitor structure CSA.

The lower electrode 260 may be formed in a pillar shape extending in a Z direction on the contact structure 246, and the dielectric film composite 270 may be conformally formed on an upper surface and a sidewall of the lower electrode 260. The dielectric film composite 270 may be formed in a nano-size structure where a plurality of second and third dielectric fillers 272 and 273 are three-dimensionally mixed and disposed in the first dielectric film 271. The upper electrode 280 may be disposed on the dielectric film composite 270.

Descriptions of the lower electrode 260, the dielectric film composite 270, and the upper electrode 280 may be substantially and respectively the same as the first electrode 160, the dielectric film composite 170, and the second electrode 180 described above with reference to FIGS. 1 and 2. Also, descriptions of the first dielectric film 271, the second dielectric filler 272, and the third dielectric filler 273 may be substantially and respectively the same as the first dielectric film 171, the second dielectric filler 172, and the third dielectric filler 173 described above with reference to FIGS. 1 and 2. Therefore, descriptions thereof are omitted.

As a result, the integrated circuit device 200 according to an embodiment may include the dielectric film composite 170 having a nano-size, where three different kinds of dielectric materials are three-dimensionally mixed and arranged, and thus, the capacitor structure CSA for securing a desired capacitance may be efficiently implemented.

Figure 9:
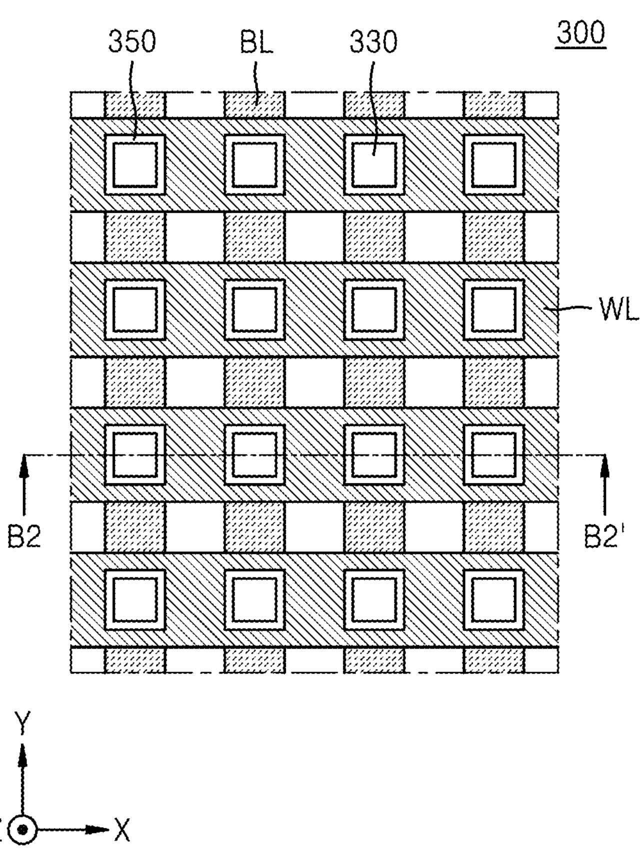
FIG. 9 is a layout illustrating an integrated circuit device according to an embodiment.
Figure 10:
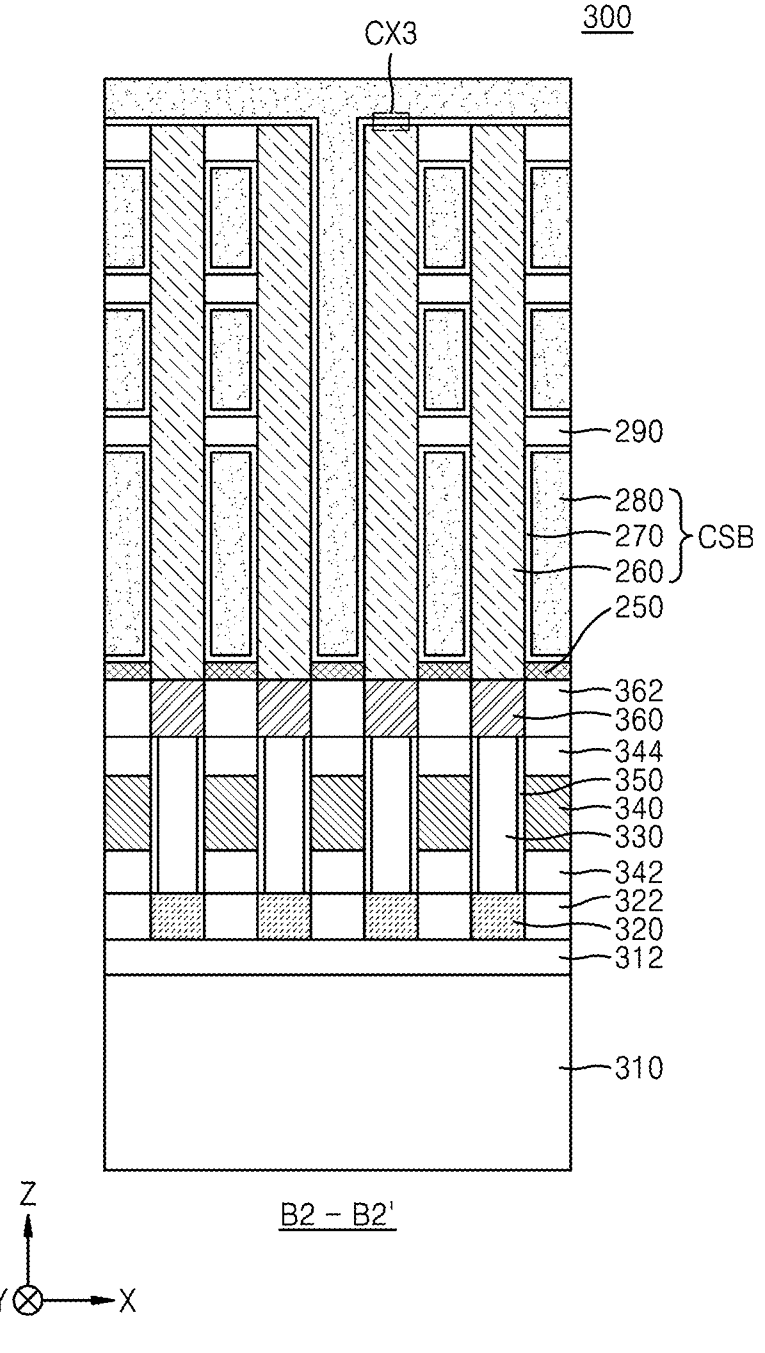
FIG. 10 is a cross-sectional view taken along line B2-B2' of FIG. 9.
Figure 11:
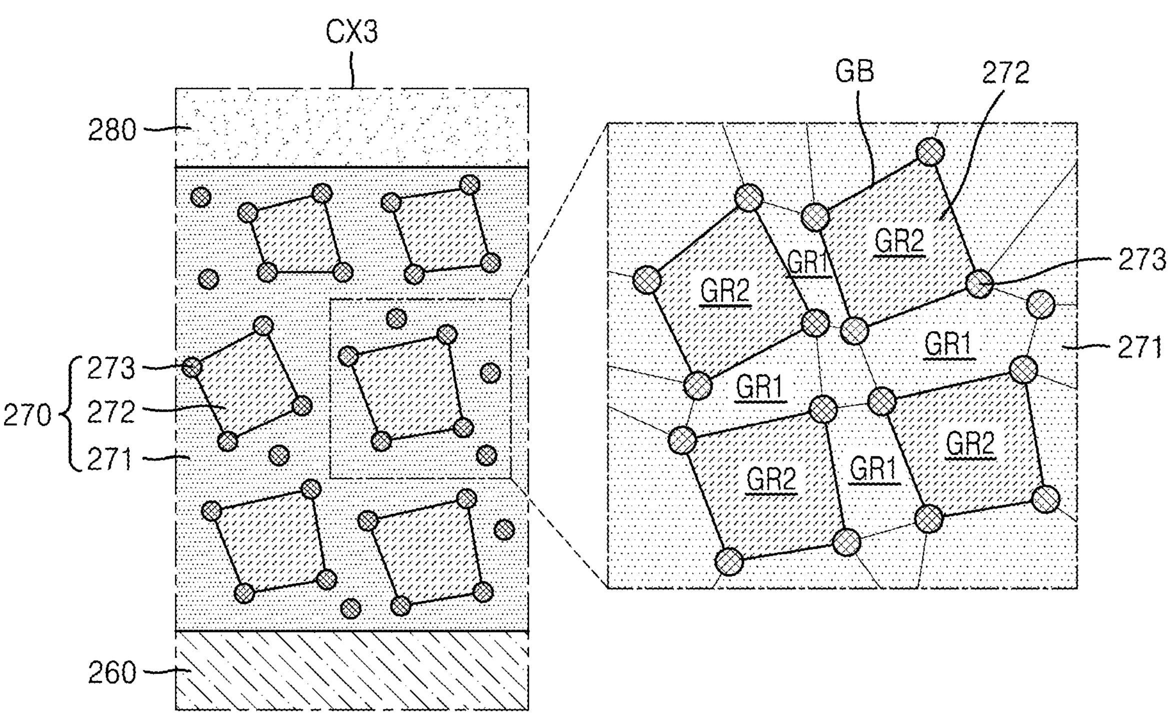
FIG. 11 is an enlarged view of a region CX3 of FIG. 10.

FIG. 9 is a layout illustrating an integrated circuit device 300 according to an embodiment, FIG. 10 is a cross-sectional view taken along line B2-B2' of FIG. 9, and FIG. 11 is an enlarged view of a region CX3 of FIG. 10.

Referring to FIGS. 9 to 11, the integrated circuit device 300 may include a capacitor structure CSB on a vertical channel transistor (VCT).

A lower insulation layer 312 may be disposed on a substrate 310, and a plurality of first conductive lines 320 may be apart from one another in an X direction and may extend in a Y direction, on the lower insulation layer 312. A plurality of first insulation patterns 322 may be disposed to fill a space between the plurality of first conductive lines 320, on the lower insulation layer 312. The plurality of first conductive lines 320 may correspond to a bit line BL of the integrated circuit device 300.

In some embodiments, the plurality of first conductive lines 320 may include doped polysilicon, metal, conductive metal nitride, conductive metal silicide, conductive metal oxide, or a combination thereof. For example, the plurality of first conductive lines 320 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO, RuO, or a combination thereof. The plurality of first conductive lines 320 may include a single-layer or multi-layer structure including at least one of the materials. In some embodiments, the plurality of first conductive lines 320 may include a 2D semiconductor material, and for example, the 2D semiconductor material may include graphene, carbon nanotube, or a combination thereof.

Channel layers 330 may be arranged in an island shape arranged apart from one another in the X direction and the Y direction on the plurality of first conductive lines 320. The channel layer 330 may have a channel width in the X direction and a channel height in a Z direction, and the channel height may be greater than the channel width. A bottom portion of the channel layer 330 may function as a first source/drain region (not shown), an upper portion of the channel layer 330 may function as a second source/drain region (not shown), and a portion of the channel layer 330 between the first and second source/drain regions may function as a channel region (not shown). The VCT may denote a structure where a channel length of the channel layer 330 extends in the Z direction from the substrate 310.

In some embodiments, the channel layer 330 may include an oxide semiconductor, and for example, the oxide semiconductor may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $AL_xZn_ySn_zO$, $Yb_xGa_yZn_zO$, $In_xGa_yO$, or a combination thereof. The channel layer 330 may include a single-layer or multi-layer structure of the oxide semiconductor. In some embodiments, the channel layer 330 may have bandgap energy which is greater than that of silicon. The channel layer 330 may include polycrystal or amorphous properties. In some embodiments, the channel layer 330 may include a 2D semiconductor material, and for example, the 2D semiconductor material may include graphene, carbon nanotube, or a combination thereof.

In some embodiments, the gate electrode 340 may surround a sidewall of the channel layer 330 and may extend in the X direction. In the drawing, the gate electrode 340 may be a gate electrode of a gate-all-around type surrounding a whole sidewall of the channel layer 330. The gate electrode 340 may correspond to a word line WL of the integrated circuit device 300.

In other embodiments, the gate electrode 340 may be a gate electrode of a dual gate type, and for example, may include a first sub gate electrode (not shown) facing a first sidewall of the channel layer 330 and a second sub gate electrode (not shown) facing a second sidewall, which is opposite to the first sidewall, of the channel layer 330.

In other embodiments, the gate electrode 340 may be a gate electrode of a single gate type, which covers only the first sidewall of the channel layer 330 and extends in the X direction.

The gate electrode 340 may include doped polysilicon, metal, conductive metal nitride, conductive metal silicide, conductive metal oxide, or a combination thereof. For example, the gate electrode 340 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof.

A gate insulation layer 350 may surround the sidewall of the channel layer 330 and may be disposed between the channel layer 330 and the gate electrode 340. In some embodiments, the gate insulation layer 350 may include silicon oxide, silicon oxynitride, a high-k dielectric film having a dielectric constant which is higher than that of silicon oxide, or a combination thereof. The high-k dielectric film may include metal oxide or metal oxynitride. For example, the high-k dielectric film included in the gate insulation layer 350 may include $HfO_2$, HfSiO, HfSiON, HfTaO, HfSiO, HfZrO, $ZrO_2$, $Al_2O_3$, or a combination thereof.

A first buried insulation layer 342 surrounding a lower sidewall of the channel layer 330 may be disposed on a plurality of first insulation patterns 322, and a second buried insulation layer 344 surrounding the upper sidewall of the channel layer 330 and covering the gate electrode 340 may be disposed on the first buried insulation layer 342.

A capacitor contact 360 may be disposed on the channel layer 330. The capacitor contact 360 may be disposed to vertically overlap the channel layer 330 and may be arranged in a matrix form arranged apart from one another in the X direction and the Y direction. For example, the capacitor contact 360 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO RuO, or a combination thereof. An upper insulation layer 362 may surround a sidewall of the capacitor contact 360, on the second buried insulation layer 344.

An etch stop layer 250 may be disposed on the upper insulation layer 362, and the capacitor structure CSB may be disposed on the etch stop layer 250. The capacitor structure CSB may include a lower electrode 260, a dielectric film composite 270, and an upper electrode 280. The lower electrode 260 may be electrically connected with the capacitor contact 360, the dielectric film composite 270 may cover the lower electrode 260, and the upper electrode 280 may cover the lower electrode 260, on the dielectric film composite 270. A supporting member 290 may be disposed on a sidewall of the lower electrode 260.

Descriptions of the lower electrode 260, the dielectric film composite 270, and the upper electrode 280 may be substantially and respectively the same as the first electrode 160, the dielectric film composite 170, and the second electrode 180 described above with reference to FIGS. 1 and 2. Also, descriptions of the first dielectric film 271, the second dielectric filler 272, and the third dielectric filler 273 may be substantially and respectively the same as the first dielectric film 171, the second dielectric filler 172, and the third dielectric filler 173 described above with reference to FIGS. 1 and 2. Therefore, descriptions thereof are omitted.

As a result, the integrated circuit device 300 according to an embodiment may include the dielectric film composite 270 having a nano-size, where three different kinds of dielectric materials are three-dimensionally mixed and arranged, and thus, the capacitor structure CSB for securing a desired capacitance may be efficiently implemented.

Figure 12:
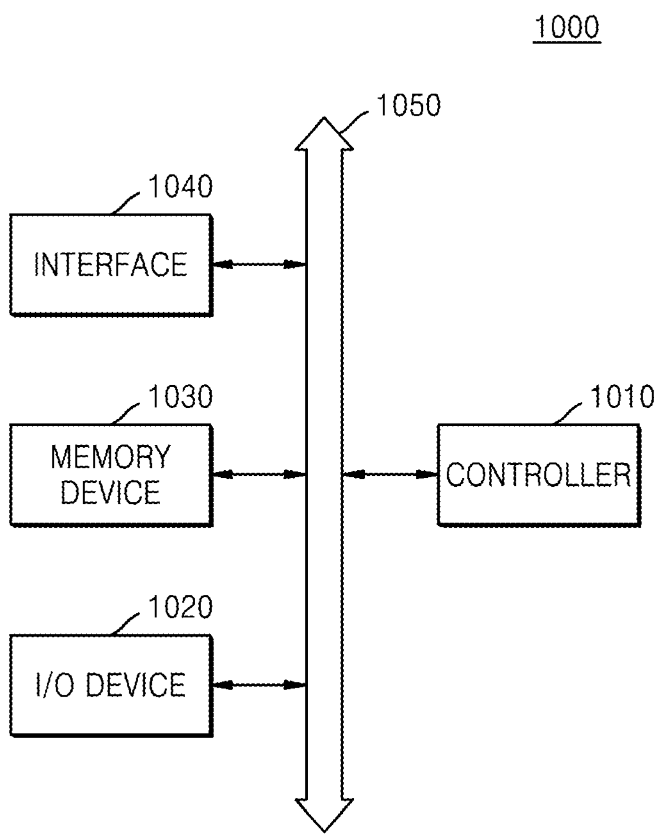
FIG. 12 is a block diagram illustrating a system including an integrated circuit device, according to an embodiment.

FIG. 12 is a block diagram illustrating a system 1000 including an integrated circuit device, according to an embodiment.

Referring to FIG. 12, the system 1000 may include a controller 1010, an input/output (I/O) device 1020, a memory device 1030, an interface 1040, and a bus 1050.

The system 1000 may be a mobile system or a system which transmits or receives information. In some embodiments, the mobile system may include a portable computer, a web tablet, a mobile phone, a digital music player, or a memory card.

The controller 1010 may be for controlling an execution program in the system 1000 and may be implemented as a microprocessor, a digital signal processor, a microcontroller, or a device similar thereto.

The I/O device 1020 may be used to input or output data of the system 1000. The system 1000 may be connected with an external device (for example, a personal computer or a network) by using the I/O device 1020 and may exchange data with the external device. The I/O device 1020 may include, for example, a touch screen, a touch pad, a keyboard, or a display.

The memory device 1030 may store data for an operation of the controller 1010, or may store data obtained through processing by the controller 1010. The memory device 1030 may include one of the integrated circuit devices 100, 200, and 300 according to an embodiment.

The interface 1040 may be a data transfer path between the system 1000 and an external device. The controller 1010, the I/O device 1020, the memory device 1030, and the interface 1040 may communicate with one another through the bus 1050.

Hereinabove, embodiments have been described in the drawings and the specification. Embodiments have been described by using the terms described herein, but this has been merely used for describing the inventive concept and has not been used for limiting a meaning or limiting the scope of the inventive concept defined in the following claims. Therefore, it may be understood by those of ordinary skill in the art that various modifications and other equivalent embodiments may be implemented from the inventive concept.

While the inventive concept has been particularly shown and described with reference to embodiments thereof, it will be understood that various changes in form and details may be made therein without departing from the spirit and scope of the following claims.

What is claimed is:

1. An integrated circuit device comprising:
a transistor disposed on a substrate; and
a capacitor structure electrically connected with the transistor, wherein
the capacitor structure comprises:
a first electrode;
a dielectric film composite disposed on the first electrode; and
a second electrode disposed on the dielectric film composite, and
the dielectric film composite comprises:
a first dielectric film including an anti-ferroelectric material;
a second dielectric filler distributed and disposed in the first dielectric film, the second dielectric filler including a ferroelectric material; and
a third dielectric filler distributed and disposed in the first dielectric film, the third dielectric filler including a paraelectric material and having an average diameter which is less than an average diameter of the second dielectric filler.

2. The integrated circuit device of claim 1, wherein:
the first dielectric film comprises first grains,
the second dielectric filler comprises second grains, and
the third dielectric filler is distributed and disposed at a grain boundary between the first grains and the second grains.

3. The integrated circuit device of claim 2, wherein, when an electric field is not applied to the dielectric film composite, the first grains correspond to a region where spontaneous polarization does not occur, and the second grains correspond to a region where spontaneous polarization occurs.

4. The integrated circuit device of claim 2, wherein, when an electric field is applied to the dielectric film composite, polarization of the first grains is accelerated based on a phase interaction between the first grains and the second grains.

5. The integrated circuit device of claim 1, wherein the second dielectric filler is included in the dielectric film composite by a content of 10% or more and less than 50%, with respect to a total mass of the dielectric film composite.

6. The integrated circuit device of claim 5, wherein:
the dielectric film composite has a first thickness in a thickness direction of the dielectric film composite, the first thickness is 10 Å to 60 Å, and
the second dielectric filler has an average diameter of 5 Å to 20 Å.

7. The integrated circuit device of claim 1, wherein the third dielectric filler is included in the dielectric film composite by a content of 1% or more and less than 10%, with respect to a total mass of the dielectric film composite.

8. The integrated circuit device of claim 7, wherein:
the dielectric film composite has a first thickness in a thickness direction of the dielectric film composite, the first thickness is 10 Å to 60 Å, and
the third dielectric filler has an average diameter of 1 Å to 5 Å.

9. The integrated circuit device of claim 1, wherein:
the first dielectric film comprises at least one of $Hf_{1-x}Zr_xO_2$ $(0.5<x<1.0)$, $ZrO_2$, $PbZrO_3$, and $PbHfO_3$,
the second dielectric filler comprises at least one of $HfO_2$, $Hf_{1-x}Zr_xO_2$ $(0<x\leq0.5)$, $Ba_{1-x}Sr_xTiO_3$ $(0\leq x\leq0.3)$, $BaTiO_3$, and $PbZr_xTi_{1-x}O_3$ $(0\leq x\leq0.1)$, and
the third dielectric filler comprises at least one of $Y_2O_3$, $Al_2O_3$, $ZrO_2$, $SiO_2$, $TiO_2$, and $Cr_2O_3$.

10. The integrated circuit device of claim 1, wherein the dielectric film composite further comprises at least one of yttrium (Yt), lanthanum (La), niobium (Nb), and tantalum (Ta) as a dopant.

11. An integrated circuit device comprising:
a transistor disposed on a substrate; and
a capacitor electrically connected with the transistor, the capacitor including a first electrode, a dielectric film composite, and a second electrode,
wherein the dielectric film composite comprises:
a first dielectric film including an anti-ferroelectric material and configuring first grains;
a second dielectric filler distributed and disposed in the first dielectric film, the second dielectric filler including a ferroelectric material and configuring second grains; and
a third dielectric filler distributed and disposed at a grain boundary between the first grains and the second grains, the third dielectric filler including a paraelectric material.

12. The integrated circuit device of claim 11, wherein the third dielectric filler is configured to apply strain to the first grains and the second grains.

13. The integrated circuit device of claim 12, wherein, when an electric field is applied to the dielectric film composite, the strain increases a phase interaction between the first grains and the second grains to accelerate polarization of the first grains.

14. The integrated circuit device of claim 11, wherein:
the first dielectric film comprises at least one of $Hf_{1-x}Zr_xO_2$ $(0.5<x<1.0)$, $ZrO_2$, $PbZrO_3$, and $PbHfO_3$,
the second dielectric filler comprises at least one of $HfO_2$, $Hf_{1-x}Zr_xO_2$ $(0<x\leq0.5)$, $Ba_{1-x}Sr_xTiO_3$ $(0\leq x\leq0.3)$, $BaTiO_3$, and $PbZr_xTi_{1-x}O_3$ $(0\leq x\leq0.1)$, and
the third dielectric filler comprises at least one of $Y_2O_3$, $Al_2O_3$, $ZrO_2$, $SiO_2$, $TiO_2$, and $Cr_2O_3$.

15. The integrated circuit device of claim 14, wherein the third dielectric filler comprises a dielectric where bandgap energy is at least 5.0 eV.

16. An integrated circuit device comprising:
a word line disposed in a word line trench extending in a first direction in a substrate;
a contact structure disposed at one side of the word line on the substrate; and
a capacitor structure disposed on the contact structure and electrically connected with the contact structure, wherein
the capacitor structure comprises:
a first electrode disposed on the contact structure;
a dielectric film composite covering the first electrode; and
a second electrode disposed on the dielectric film composite, and
the dielectric film composite comprises:
a first dielectric film including an anti-ferroelectric material;
a second dielectric filler distributed and disposed in the first dielectric film, the second dielectric filler including a ferroelectric material; and
a third dielectric filler distributed and disposed in the first dielectric film, the third dielectric filler including a paraelectric material and having an average diameter which is less than an average diameter of the second dielectric filler.

17. The integrated circuit device of claim 16, wherein:
the first dielectric film comprises first grains based on a T-phase of a tetragonal crystal structure,
the second dielectric filler comprises second grains based on an O-phase of an orthorhombic crystal structure, and
the third dielectric filler is distributed and disposed at a grain boundary between the first grains and the second grains.

18. The integrated circuit device of claim 17, wherein:
when an electric field is not applied to the dielectric film composite, the first grains correspond to a region where spontaneous polarization does not occur and the second grains correspond to a region where spontaneous polarization occurs, and
when an electric field is applied to the dielectric film composite, polarization of the first grains is accelerated based on a phase interaction between the first grains and the second grains.

19. The integrated circuit device of claim 16, wherein:
the second dielectric filler is included in the dielectric film composite by a content of 10% or more and less than 50%, with respect to a total mass of the dielectric film composite, the third dielectric filler is included in the dielectric film composite by a content of 1% or more and less than 10%, with respect to a total mass of the dielectric film composite, and a content of the first dielectric film is higher than a sum of a content of the second dielectric filler and a content of the third dielectric filler, with respect to a total mass of the dielectric film composite.

20. The integrated circuit device of claim 16, wherein:

the dielectric film composite further comprises a dopant, and the dopant comprises at least one of yttrium (Yt), lanthanum (La), niobium (Nb), and tantalum (Ta).

* * * * *